(12) United States Patent
Hattori et al.

(10) Patent No.: US 8,339,752 B1
(45) Date of Patent: Dec. 25, 2012

(54) MAGNETIC HEAD WITH WIDE SENSOR BACK EDGE, LOW RESISTANCE, AND HIGH SIGNAL TO-NOISE RATIO AND METHODS OF PRODUCTION THEREOF

(75) Inventors: Masashi Hattori, Odawara (JP); Koichi Nishioka, Hiratsuka (JP); Koji Sakamoto, Odawara (JP); Tsutomu Yasuda, Odawara (JP); Hideki Mashima, Hiratsuka (JP)

(73) Assignee: Hitachi Global Storage Technologies Netherlands B.V., Amsterdam (NL)

( * ) Notice: Subject to any disclaimer, the term of this patent is extended or adjusted under 35 U.S.C. 154(b) by 0 days.

(21) Appl. No.: 13/245,708

(22) Filed: Sep. 26, 2011

(51) Int. Cl.
*G11B 5/39* (2006.01)
(52) U.S. Cl. ............ 360/324.12; 360/324.2; 29/603.1
(58) Field of Classification Search ........... 360/324.12, 360/324.2; 29/603.1
See application file for complete search history.

(56) References Cited

U.S. PATENT DOCUMENTS

| | | | |
|---|---|---|---|
| 6,344,954 B1 | 2/2002 | Redon et al. | |
| 6,519,124 B1 | 2/2003 | Redon et al. | |
| 6,542,343 B1 | 4/2003 | Gill | |
| 6,605,836 B2 | 8/2003 | Kishi et al. | |
| 6,724,582 B2 | 4/2004 | Funayama et al. | |
| 6,735,062 B1 | 5/2004 | Pokhil et al. | |
| 6,738,234 B1 | 5/2004 | Araki et al. | |
| 6,741,433 B1 | 5/2004 | Nishioka | |
| 7,075,761 B2 * | 7/2006 | Parker | 360/324.12 |
| 7,365,949 B2 | 4/2008 | Hayakawa et al. | |
| 7,580,228 B1 | 8/2009 | Lauer | |
| 2009/0002898 A1 * | 1/2009 | Childress et al. | 360/324.1 |
| 2011/0007426 A1 | 1/2011 | Qiu et al. | |
| 2011/0050211 A1 | 3/2011 | Gao et al. | |
| 2011/0051294 A1 | 3/2011 | Gao et al. | |

FOREIGN PATENT DOCUMENTS

| | | |
|---|---|---|
| JP | 2008078214 A | 4/2008 |
| JP | 2008299995 A | 12/2008 |

* cited by examiner

*Primary Examiner* — Craig A. Renner
*Assistant Examiner* — Gustavo Polo
(74) *Attorney, Agent, or Firm* — Zilka-Kotab, PC

(57) ABSTRACT

In one embodiment, a magnetic head includes a magnetoresistive free layer, wherein a width of the free layer nearest an air bearing surface (ABS) is less than a width of the free layer at a point away from the ABS in a track width direction, with the magnetic head being configured to pass a sense current in a direction perpendicular to a plane of deposition of the free layer. In another embodiment, a method includes forming a magnetoresistive film above a shield, forming a masking layer above the magnetoresistive film, patterning the masking layer such that it exposes portions of the magnetoresistive film, wherein the masking layer defines an area which is narrow near an area that forms an ABS side of a free layer and wider at an area away from the ABS, and removing the exposed portions of the magnetoresistive film to form the free layer.

25 Claims, 15 Drawing Sheets

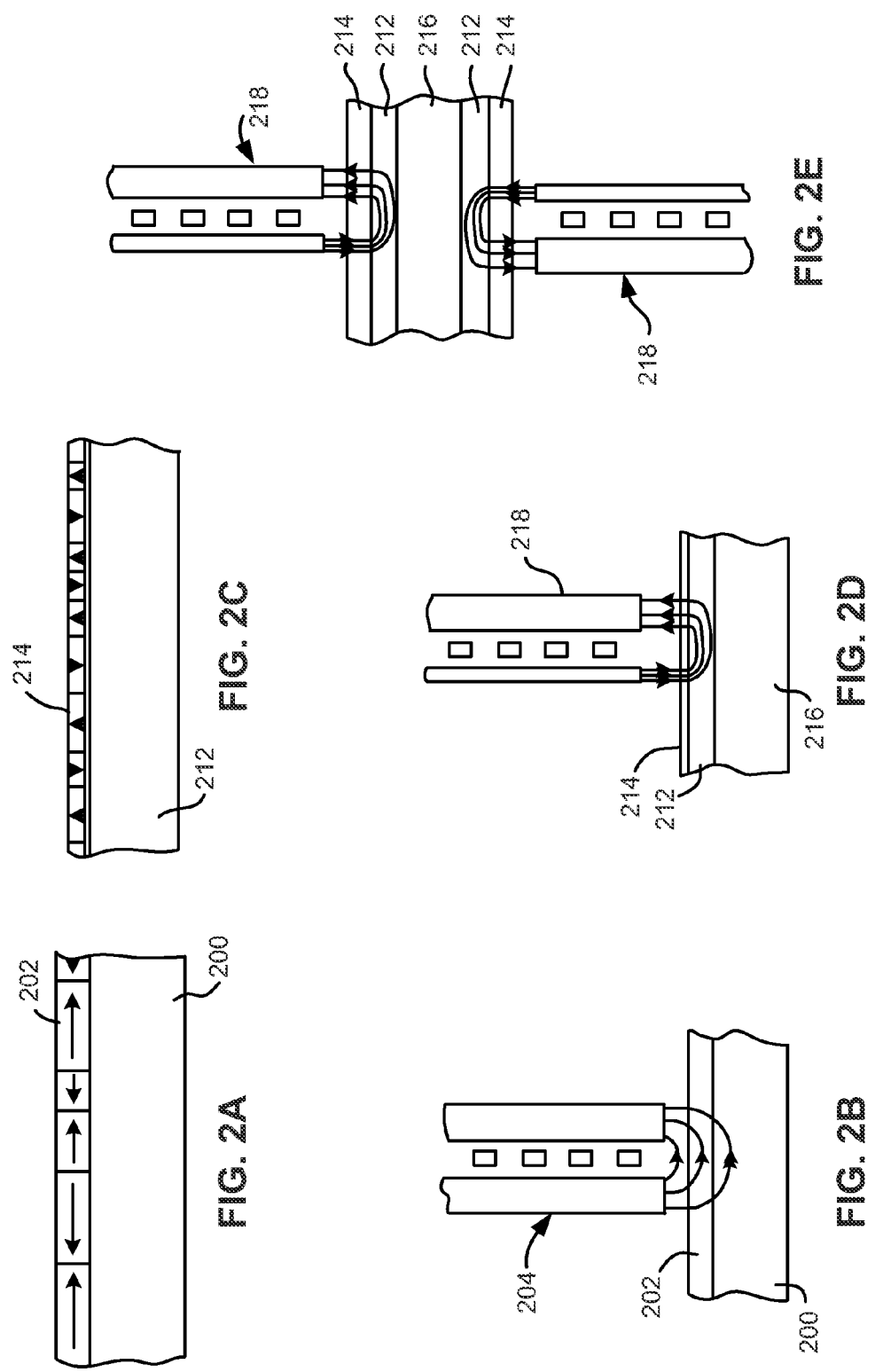

MAGNETIC HEAD WITH WIDE SENSOR BACK EDGE, LOW RESISTANCE, AND HIGH SIGNAL TO-NOISE RATIO AND METHODS OF PRODUCTION THEREOF

FIELD OF THE INVENTION

The present invention relates to data storage systems, and more particularly, this invention relates to magnetic heads having a wide sensor back edge leading to low resistance and high signal-to-noise ratio.

BACKGROUND

The heart of a computer is a magnetic hard disk drive (HDD) which typically includes a rotating magnetic disk, a slider that has read and write heads, a suspension arm above the rotating disk and an actuator arm that swings the suspension arm to place the read and/or write heads over selected circular tracks on the rotating disk. The suspension arm biases the slider into contact with the surface of the disk when the disk is not rotating but, when the disk rotates, air is swirled by the rotating disk adjacent an air bearing surface (ABS) of the slider causing the slider to ride on an air bearing a slight distance from the surface of the rotating disk. When the slider rides on the air bearing the write and read heads are employed for writing magnetic impressions to and reading magnetic signal fields from the rotating disk. The read and write heads are connected to processing circuitry that operates according to a computer program to implement the writing and reading functions.

The volume of information processing in the information age is increasing rapidly. In particular, HDDs have been desired to store more information in its limited area and volume. A technical approach to this desire is to increase the capacity by increasing the recording density of the HDD. To achieve higher recording density, further miniaturization of recording bits is effective, which in turn typically requires the design of smaller and smaller components.

The further miniaturization of the various components, however, presents its own set of challenges and obstacles. In recent years, magnetoresistive heads which generally employ a tunnel magnetoresistance (TMR) film have been used in HDD reproduction sensors. In magnetoresistive heads that employ a TMR film, a sense current flows in a direction perpendicular to the TMR film plane. Furthermore, the relative angle of magnetization of the magnetization free layer and the magnetization fixed layer of the TMR film changes due to field leakage from the medium, and the tunnel resistance changes whereby reproduction output commensurate with the magnetization orientation of the medium is obtained.

SUMMARY

In one embodiment, a magnetic head includes a magnetoresistive free layer, wherein a width of the free layer in a track width direction nearest an air bearing surface (ABS) is less than a width of the free layer in the track width direction at a point away from the ABS, wherein the magnetic head is configured to pass a sense current in a direction perpendicular to a plane of deposition of the free layer.

In another embodiment, a method includes forming a first shield above a substrate, forming a magnetoresistive film layer above the first shield, forming a first masking layer above the magnetoresistive film layer, patterning the first masking layer such that it exposes portions of the magnetoresistive film layer, wherein the first masking layer defines an area which is narrow near an area that forms an ABS side of a free layer and wider at an area away from the ABS side of the free layer, and removing the exposed portions of the magnetoresistive film layer to form the free layer. Any of these embodiments may be implemented in a magnetic data storage system such as a disk drive system, which may include a magnetic head, a drive mechanism for passing a magnetic medium (e.g., hard disk) over the magnetic head, and a controller electrically coupled to the magnetic head.

Other aspects and advantages of the present invention will become apparent from the following detailed description, which, when taken in conjunction with the drawings, illustrate by way of example the principles of the invention.

BRIEF DESCRIPTION OF THE DRAWINGS

For a fuller understanding of the nature and advantages of the present invention, as well as the preferred mode of use, reference should be made to the following detailed description read in conjunction with the accompanying drawings.

FIG. 2A is a schematic representation in section of a recording medium utilizing a longitudinal recording format.

FIG. 2B is a schematic representation of a conventional magnetic recording head and recording medium combination for longitudinal recording as in FIG. 2A.

FIG. 2C is a magnetic recording medium utilizing a perpendicular recording format.

FIG. 2D is a schematic representation of a recording head and recording medium combination for perpendicular recording on one side.

FIG. 2E is a schematic representation of a recording apparatus adapted for recording separately on both sides of the medium.

DETAILED DESCRIPTION

The following description is made for the purpose of illustrating the general principles of the present invention and is not meant to limit the inventive concepts claimed herein. Further, particular features described herein can be used in combination with other described features in each of the various possible combinations and permutations.

Unless otherwise specifically defined herein, all terms are to be given their broadest possible interpretation including meanings implied from the specification as well as meanings understood by those skilled in the art and/or as defined in dictionaries, treatises, etc.

It must also be noted that, as used in the specification and the appended claims, the singular forms "a," "an" and "the" include plural referents unless otherwise specified.

The following description discloses several preferred embodiments of disk-based storage systems and/or related systems and methods, as well as operation and/or component parts thereof.

In one general embodiment, a magnetic head includes a magnetoresistive free layer, wherein a width of the free layer in a track width direction nearest an air bearing surface (ABS) is less than a width of the free layer in the track width direction at a point away from the ABS, wherein the magnetic head is configured to pass a sense current in a direction perpendicular to a plane of deposition of the free layer.

In another general embodiment, a method includes forming a first shield above a substrate, forming a magnetoresistive film layer above the first shield, forming a first masking layer above the magnetoresistive film layer, patterning the first masking layer such that it exposes portions of the magnetoresistive film layer, wherein the first masking layer defines an area which is narrow near an area that forms an ABS side of a free layer and wider at an area away from the ABS side of the free layer, and removing the exposed portions of the magnetoresistive film layer to form the free layer.

Figure 1:
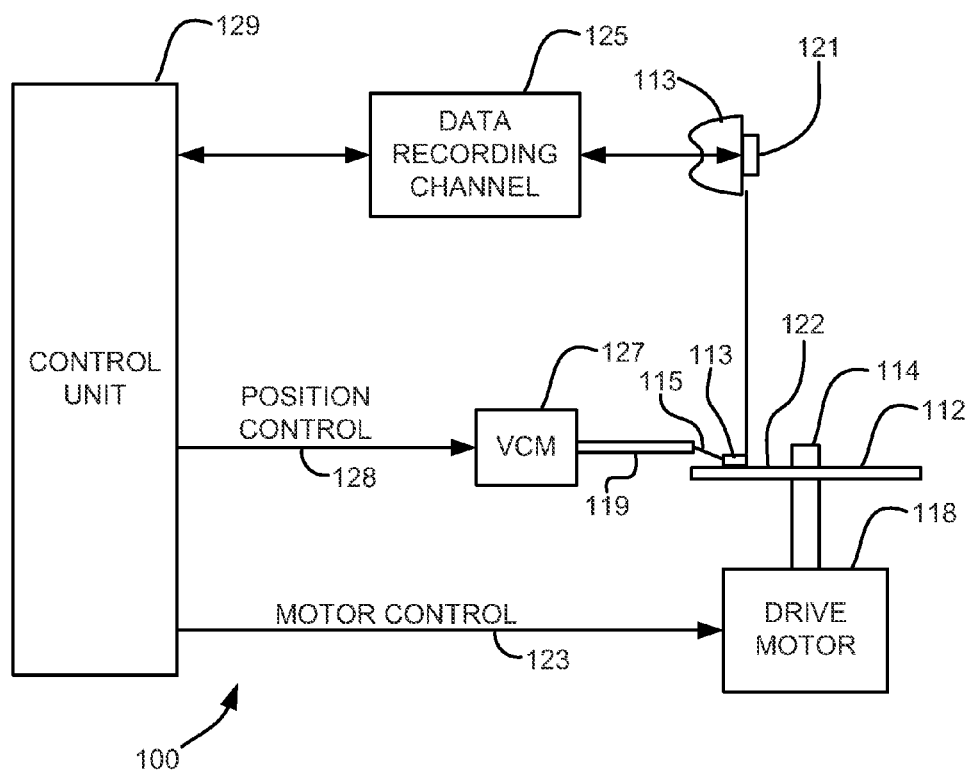
FIG. 1 is a simplified drawing of a magnetic recording disk drive system.

Referring now to FIG. 1, there is shown a disk drive 100 in accordance with one embodiment of the present invention. As shown in FIG. 1, at least one rotatable magnetic disk 112 is supported on a spindle 114 and rotated by a disk drive motor 118. The magnetic recording on each disk is typically in the form of an annular pattern of concentric data tracks (not shown) on the disk 112.

At least one slider 113 is positioned near the disk 112, each slider 113 supporting one or more magnetic read/write heads 121. As the disk rotates, slider 113 is moved radially in and out over disk surface 122 so that heads 121 may access different tracks of the disk where desired data are recorded and/or to be written. Each slider 113 is attached to an actuator arm 119 by means of a suspension 115. The suspension 115 provides a slight spring force which biases slider 113 against the disk surface 122. Each actuator arm 119 is attached to an actuator 127. The actuator 127 as shown in FIG. 1 may be a voice coil motor (VCM). The VCM comprises a coil movable within a fixed magnetic field, the direction and speed of the coil movements being controlled by the motor current signals supplied by controller 129.

During operation of the disk storage system, the rotation of disk 112 generates an air bearing between slider 113 and disk surface 122 which exerts an upward force or lift on the slider. The air bearing thus counter-balances the slight spring force of suspension 115 and supports slider 113 off and slightly above the disk surface by a small, substantially constant spacing during normal operation. Note that in some embodiments, the slider 113 may slide along the disk surface 122.

The various components of the disk storage system are controlled in operation by control signals generated by control unit 129, such as access control signals and internal clock signals. Typically, control unit 129 comprises logic control circuits, storage (e.g., memory), and a microprocessor. The control unit 129 generates control signals to control various system operations such as drive motor control signals on line 123 and head position and seek control signals on line 128. The control signals on line 128 provide the desired current profiles to optimally move and position slider 113 to the desired data track on disk 112. Read and write signals are communicated to and from read/write heads 121 by way of recording channel 125.

The above description of a typical magnetic disk storage system, and the accompanying illustration of FIG. 1 is for representation purposes only. It should be apparent that disk storage systems may contain a large number of disks and actuators, and each actuator may support a number of sliders.

An interface may also be provided for communication between the disk drive and a host (integral or external) to send and receive the data and for controlling the operation of the disk drive and communicating the status of the disk drive to the host, all as will be understood by those of skill in the art.

In a typical head, an inductive write head includes a coil layer embedded in one or more insulation layers (insulation stack), the insulation stack being located between first and second pole piece layers. A gap is formed between the first and second pole piece layers by a gap layer at an air bearing surface (ABS) of the write head. The pole piece layers may be connected at a back gap. Currents are conducted through the cod layer, which produce magnetic fields in the pole pieces. The magnetic fields fringe across the gap at the ABS for the purpose of writing bits of magnetic field information in tracks on moving media, such as in circular tracks on a rotating magnetic disk.

The second pole piece layer has a pole tip portion which extends from the ABS to a flare point and a yoke portion which extends from the flare point to the back gap. The flare point is where the second pole piece begins to widen (flare) to form the yoke. The placement of the flare point directly affects the magnitude of the magnetic field produced to write information on the recording medium.

FIG. 2A illustrates, schematically, a conventional recording medium such as used with magnetic disc recording systems, such as that shown in FIG. 1. This medium is utilized for recording magnetic impulses in or parallel to the plane of the medium itself. The recording medium, a recording disc in this instance, comprises basically a supporting substrate 200 of a suitable non-magnetic material such as glass, with an overlying coating 202 of a suitable and conventional magnetic layer.

FIG. 2B shows the operative relationship between a conventional recording/playback head 204, which may preferably be a thin film head, and a conventional recording medium, such as that of FIG. 2A.

FIG. 2C illustrates, schematically, the orientation of magnetic impulses substantially perpendicular to the surface of a recording medium as used with magnetic disc recording systems, such as that shown in FIG. 1. For such perpendicular recording the medium typically includes an under layer 212 of a material having a high magnetic permeability. This under layer 212 is then provided with an overlying coating 214 of magnetic material preferably having a high coercivity relative to the under layer 212.

FIG. 2D illustrates the operative relationship between a perpendicular head 218 and a recording medium. The recording medium illustrated in FIG. 2D includes both the high permeability under layer 212 and the overlying coating 214 of magnetic material described with respect to FIG. 2C above. However, both of these layers 212 and 214 are shown applied to a suitable substrate 216. Typically there is also an additional layer (not shown) called an "exchange-break" layer or "interlayer" between layers 212 and 214.

In this structure, the magnetic lines of flux extending between the poles of the perpendicular head 218 loop into and out of the overlying coating 214 of the recording medium with the high permeability under layer 212 of the recording medium causing the lines of flux to pass through the overlying coating 214 in a direction generally perpendicular to the surface of the medium to record information in the overlying coating 214 of magnetic material preferably having a high coercivity relative to the under layer 212 in the form of magnetic impulses having their axes of magnetization substantially perpendicular to the surface of the medium. The flux is channeled by the soft underlying coating 212 back to the return layer (P1) of the head 218.

FIG. 2E illustrates a similar structure in which the substrate 216 carries the layers 212 and 214 on each of its two opposed sides, with suitable recording heads 218 positioned adjacent the outer surface of the magnetic coating 214 on each side of the medium, allowing for recording on each side of the medium.

Figure 3A:
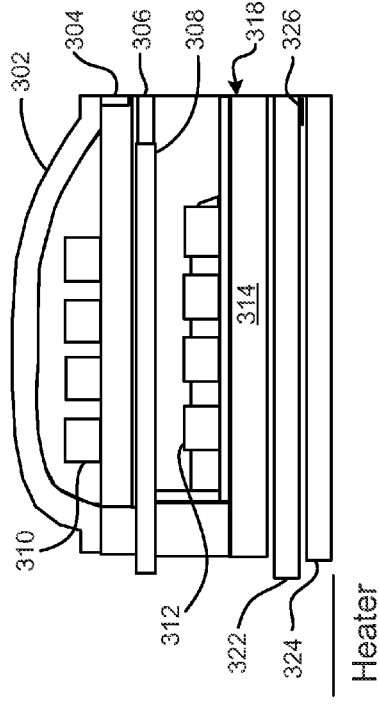
FIG. 3A is a cross-sectional view of one particular embodiment of a perpendicular magnetic head with helical coils.

FIG. 3A is a cross-sectional view of a perpendicular magnetic head. In FIG. 3A, helical coils 310 and 312 are used to create magnetic flux in the stitch pole 308, which then delivers that flux to the main pole 306. Coils 310 indicate coils extending out from the page, while coils 312 indicate coils extending into the page. Stitch pole 308 may be recessed from the ABS 318. Insulation 316 surrounds the coils and may provide support for some of the elements. The direction of the media travel, as indicated by the arrow to the right of the structure, moves the media past the lower return pole 314 first, then past the stitch pole 308, main pole 306, trailing shield 304 which may be connected to the wrap around shield (not shown), and finally past the upper return pole 302. Each of these components may have a portion in contact with the ABS 318. The ABS 318 is indicated across the right side of the structure.

Perpendicular writing is achieved by forcing flux through the stitch pole 308 into the main pole 306 and then to the surface of the disk positioned towards the ABS 318.

Figure 3B:
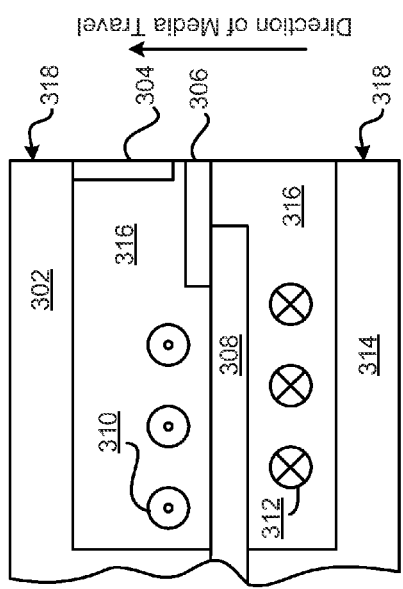
FIG. 3B is a cross-sectional view of one particular embodiment of a piggyback magnetic head with helical coils.

FIG. 3B illustrates a piggyback magnetic head having similar features to the head of FIG. 3A. Two shields 304, 314 flank the stitch pole 308 and main pole 306. Also sensor shields 322, 324 are shown. The sensor 326 is typically positioned between the sensor shields 322, 324.

Figure 4A:
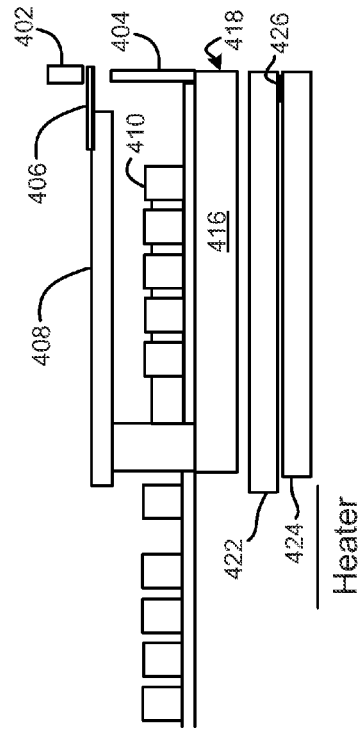
FIG. 4A is a cross-sectional view of one particular embodiment of a perpendicular magnetic head with looped coils.

FIG. 4A is a schematic diagram of one embodiment which uses looped coils 410, sometimes referred to as a pancake configuration, to provide flux to the stitch pole 408. The stitch pole then provides this flux to the main pole 406. In this orientation, the lower return pole is optional. Insulation 416 surrounds the coils 410, and may provide support for the stitch pole 408 and main pole 406. The stitch pole may be recessed from the ABS 418. The direction of the media travel, as indicated by the arrow to the right of the structure, moves the media past the stitch pole 408, main pole 406, trailing shield 404 which may be connected to the wrap around shield (not shown), and finally past the upper return pole 402 (all of which may or may not have a portion in contact with the ABS 418). The ABS 418 is indicated across the right side of the structure. The trailing shield 404 may be in contact with the main pole 406 in some embodiments.

Figure 4B:
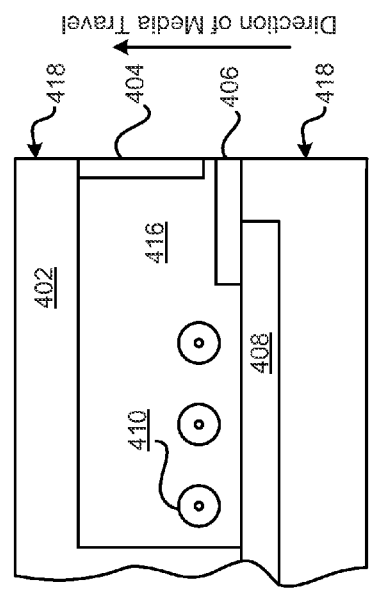
FIG. 4B is a cross-sectional view of one particular embodiment of a piggyback magnetic head with looped coils.

FIG. 4B illustrates another type of piggyback magnetic head having similar features to the head of FIG. 4A including a looped coil 410, which wraps around to form a pancake coil. Also, sensor shields 422, 424 are shown. The sensor 426 is typically positioned between the sensor shields 422, 424.

In FIGS. 3B and 4B, an optional heater is shown near the non-ABS side of the magnetic head. A heater (Heater) may also be included in the magnetic heads shown in FIGS. 3A and 4A. The position of this heater may vary based on design parameters such as where the protrusion is desired, coefficients of thermal expansion of the surrounding layers, etc.

The areal recording density of recent hard disk drives (HDDs) has reached 500 Gb/inch$^2$, and the recording tracks on the medium are very dense. The track width on the reproduction head therefore should be very small, preferably 100 nm or less. With reproduction heads having such a small track width, there is a problematic reduction in the cross-sectional area of the magnetoresistive film, such as a tunneling magnetoresistance (TMR) film stack or current perpendicular-to-plane (CPP) film stack, in the direction perpendicular to the film plane in which the sense current flows. As a result, the element resistance increases and noise due to electrical resistance increases. Therefore, narrow-track-width reproduction heads require lower resistance of the magnetoresistive film. In a region where the track width is 100 nm or less, the resistance area product (RA) of a TMR film, for example, should conventionally be no greater than 2 $\Omega\mu m^2$, and the TMR ratio generally decreases sharply in such a region.

It is therefore advantageous to increase the TMR ratio in order to maintain the reproduction output of the head in this narrow-track-width region, but there are problems in that it is very difficult to further improve the film characteristics and in that it is also difficult to obtain adequate reproduction output simply by improving the characteristics of the TMR film. It should be noted that these problems are the same when a CPP-GMR film is used, and the rate of change in the magnetoresistance still decreases when the RA decreases, so improving the characteristics of GMR films would prove truly advantageous to the field of data storage. Further, problems arise because patterning of the mask material is also very difficult in regions where the reproduction track width is less than about 100 nm.

Conventional methods for producing the track portion of the reproduction head, which is similar to a semiconductor process, generally involves a formation process as follows. An element on which a micropattern has been formed, such as through photolithography using a photosensitizing agent, such as a photoresist, is used as a mask, and the magnetoresistive film is then etched by means of ion milling or reactive ion etching (RIE), but the mask pattern in this process also needs to be formed with a width of 100 nm or less in accordance with the reproduction track width. In order to prevent erasure of the mask material during etching in this process, the patterning may be applied with an adequate mask height, but the resulting problem is that there is a far greater risk of collapse due to the increased aspect ratio of the mask material.

In order to overcome these difficulties, a magnetic head, according to one embodiment, is a magnetoresistive reproduction head in which a sense current flows in a direction perpendicular to a plane of deposition of the films comprising the sensor stack. The magnetic head may comprise a magnetoresistive free layer and an air bearing surface (ABS), in which a width of the free layer in a direction parallel to the ABS perpendicular to a direction of movement of the magnetic medium (the direction perpendicular to the direction of movement of the magnetic medium is referred to as a track width direction) is less than a width of the free layer in the track width direction at a point away from the ABS, e.g., the width of the free layer increases from the ABS in a direction normal to the ABS (a height direction).

The magnetic head may also comprise, in some embodiments, all or some of: a shield layer below the free layer adjacent to the free layer, an insulating film positioned above the shield layer (which may be on sides of the free layer in the track width direction), and a hard magnetic film on sides of the free layer in the track width direction.

The free layer at the ABS has a small width, and increases in width in the height direction, and as a result, the cross-sectional area when a sense current flows to the magnetoresistive element is increased, whereby the electrical resistance may be reduced and the resistance noise may be reduced while the effective track width is maintained. This allows reading and writing data at a higher recording density.

Furthermore, when a mask material is patterned with the track pattern using photolithography, etching, or some other suitable method, it is possible to prevent collapse of the mask material as a result of increased aspect ratio by using a mask pattern in which the track width increases from the air bearing surface in the height direction. The volume of the mask material, such as a photoresist, is also increased by using the above mentioned mask pattern, and the lift-off properties during element formation, which present a problem in the narrow-track region, may thus be further improved.

Figure 5A:
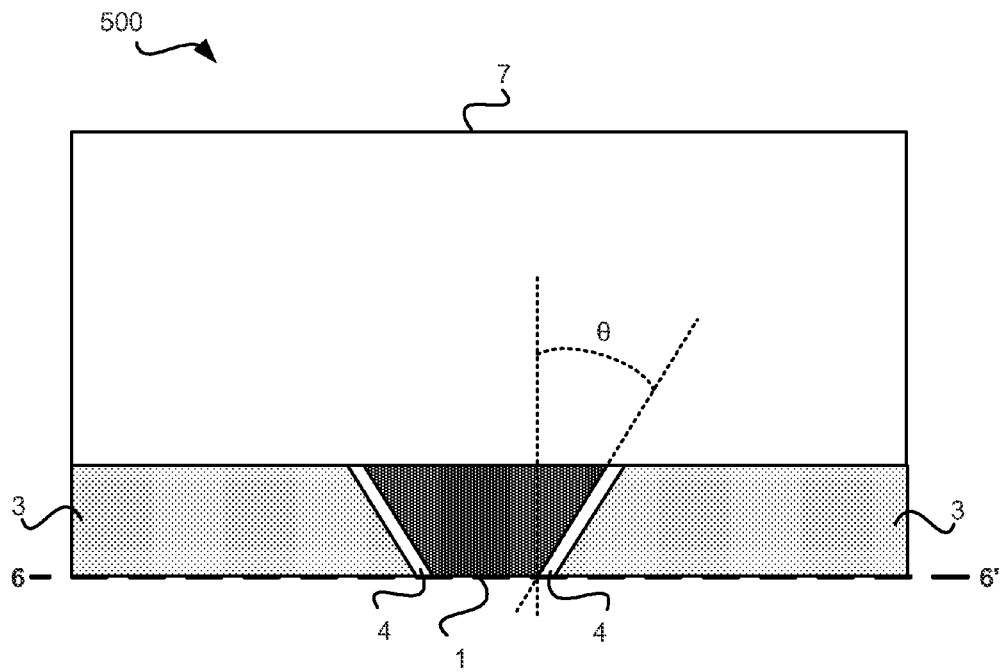
FIG. 5A shows a top view of a magnetic head, according to one embodiment.
Figure 5B:
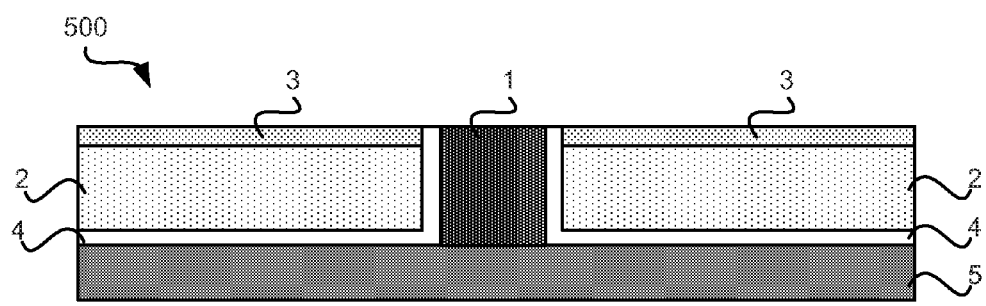
FIG. 5B shows a cross-section of the magnetic head taken from line 6-6' in FIG. 5A as seen from the air bearing surface (ABS), according to one embodiment.

Referring now to FIGS. 5A-5B, a magnetic head 500 is shown according to one embodiment. FIG. 5A shows a top view of the magnetic head 500, and FIG. 5B shows an ABS view of the magnetic head 500 taken from line 6-6' in FIG. 5A. The magnetic head 500, according to various embodiments, may comprise any or all of the layers described herein according to various embodiments. In one embodiment, the magnetic head 500 comprises a free layer 1, which may be formed from a magnetoresistive film, wherein a width of the free layer 1 in the track width direction at an ABS is less than a width of the free layer 1 in the track width direction at a point away from the ABS. During read operations, a sense current flows in a direction perpendicular to a plane of deposition of the free layer 1, e.g., it is a CPP head.

As shown in FIG. 5A, an angle $\theta$ formed by the spread of the track width and the direction normal to the ABS may be preferably no greater than about 20° in order to account for any misalignment when the track pattern and the height pattern, which determines the length of the track in the height direction from the ABS, are superimposed or placed over one another. In more embodiments, the angle $\theta$ may be in a range from about 5° to about 15°, from about 10° to about 20°, from about 15° to about 20°, etc.

In one embodiment, a cross-section of the free layer 1 in the plane of deposition thereof has a portion having a trapezoidal shape, wherein a narrow portion of the trapezoidal shaped portion is positioned nearer to the ABS than a wide portion of the trapezoidal shaped portion, as shown in FIG. 5A. In a further embodiment, the angle $\theta$ formed between a direction normal to the ABS and an edge of the trapezoidal shaped portion leading away from the ABS may be greater than 0° and less than about 20°, such as about 5°, about 10°, about 15°, etc.

In one embodiment, a TMR sensor may comprise the free layer 1 and a tunnel barrier layer of a type known in the art. Of course, any other magnetic head that uses a CPP head may make use of the read sensor described herein, according to various embodiments.

According to some embodiments, the magnetic head 500 may also comprise a shield layer 5, which may be a combined electrode/shield, a hard magnetic film 2 positioned near the free layer 1 on either side of the free layer 1 in the track width direction, an insulating film 4 positioned above the shield layer 5 which may be for electrically insulating a free layer 1 from a hard magnetic film 2, and a capping film 3 positioned above the hard magnetic film 2. In one embodiment, the insulating film 4 may be positioned on either side of the free layer 1 in the track width direction between the free layer 1 and the hard magnetic film 2.

In one embodiment, the shield layer 5 may be positioned adjacent the free layer 1 in a direction normal to the track width direction.

As shown in FIG. 5B, in the vicinity of the free layer 1, and the boundary of the capping film 3 of the hard magnetic film 2 and the insulating film 4, the plane of deposition is parallel to the surface of the paper. The line 6-6' in FIG. 5B denotes the ABS. According to one embodiment, the magnetic head 500 has a shape in which the track width of the free layer 1 grows larger with increasing distance away from the ABS. The region which is further away from the ABS than the region where the free layer 1 is present at the ABS may be embedded in a second insulating film 7.

According to one embodiment, a cross-section of the free layer 1 in the plane of deposition thereof has a trapezoidal shape away from the ABS, with a narrow portion of the trapezoidal shaped portion being positioned nearer to the ABS than a wide portion of the trapezoidal shaped portion.

Figure 6:
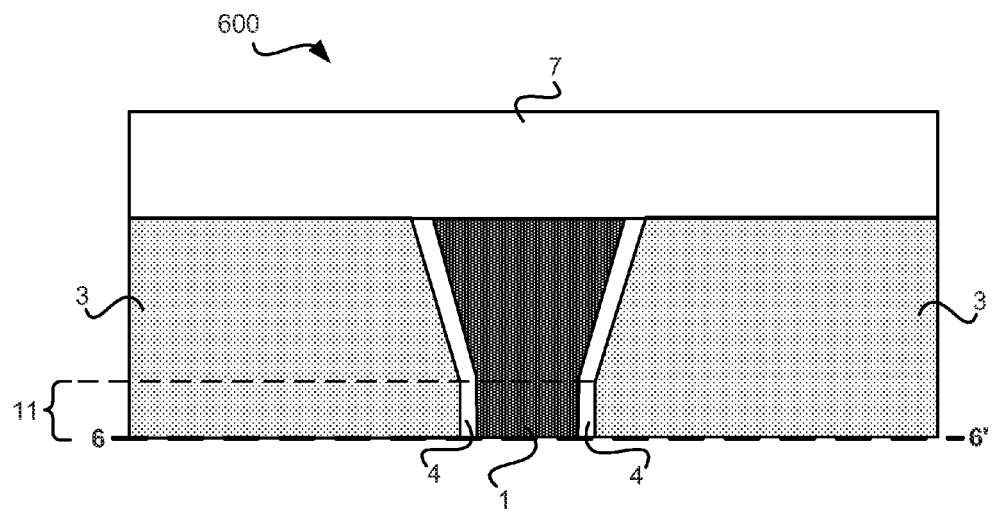
FIG. 6 shows a top view of a magnetic head, according to one embodiment.

FIG. 6 is a top view of the magnetic head 600, according to one embodiment, in which a cross-section of the free layer 1 in the plane of deposition thereof has a shape defined by a rectangular shape near to the ABS, denoted by area 11, and a trapezoidal shape at a point away from the ABS, with a narrow portion of the trapezoidal shaped portion being positioned adjacent the rectangular shaped portion. This may be described as a consistent-track-width region 11 near to the vicinity of the ABS, and another region away from the ABS having a trapezoidal shaped portion. This shape enables restriction of variations in element resistance and track width due to offsets in the lapping process, which are problematic in some conventional heads. The cross-sectional area of the free layer 1 in this embodiment is thereby reduced and the negative effects of reducing head resistance are diminished.

In a further embodiment, the angle θ formed between a direction normal to the ABS and an edge of the trapezoidal shaped portion leading away from the rectangular shaped portion may be greater than 0° and less than about 20°, such as about 5°, about 10°, about 15°, etc.

Figure 7:
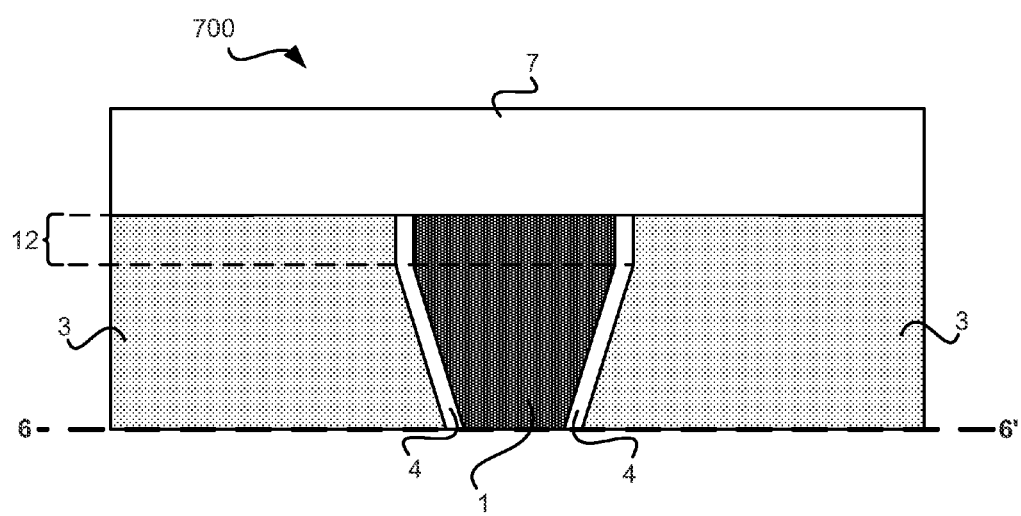
FIG. 7 shows a top view of a magnetic head, according to one embodiment.

FIG. 7 is a top view of a magnetic head 700 according to one embodiment. As shown in FIG. 7, a cross-section of the free layer 1 in the plane of deposition thereof has a shape defined by a rectangular shape, as denoted by region 12, away from the ABS and a trapezoidal shaped portion near to the ABS adjacent to the rectangular shaped portion. A narrow portion of the trapezoidal shape is positioned adjacent the ABS and a wide portion of the trapezoidal shaped portion is positioned adjacent the rectangular shaped portion, according to one embodiment. This may be described as a consistent-track-width region 12 in the vicinity of the boundary between the free layer 1 and the second insulating film 7. Furthermore, in this embodiment, the film plane may be substantially parallel to the surface of the paper. The shape in FIG. 7 makes it possible to restrict variations in element resistance due to misalignment when the track pattern and the height pattern are placed one over the other or superimposed, which may be problematic in conventional magnetic heads.

In a further embodiment, the angle θ formed between a direction normal to the ABS and an edge of the trapezoidal shaped portion leading away from the ABS may be greater than 0° and less than about 20°, such as about 5°, about 10°, about 15°, etc.

Figure 8:
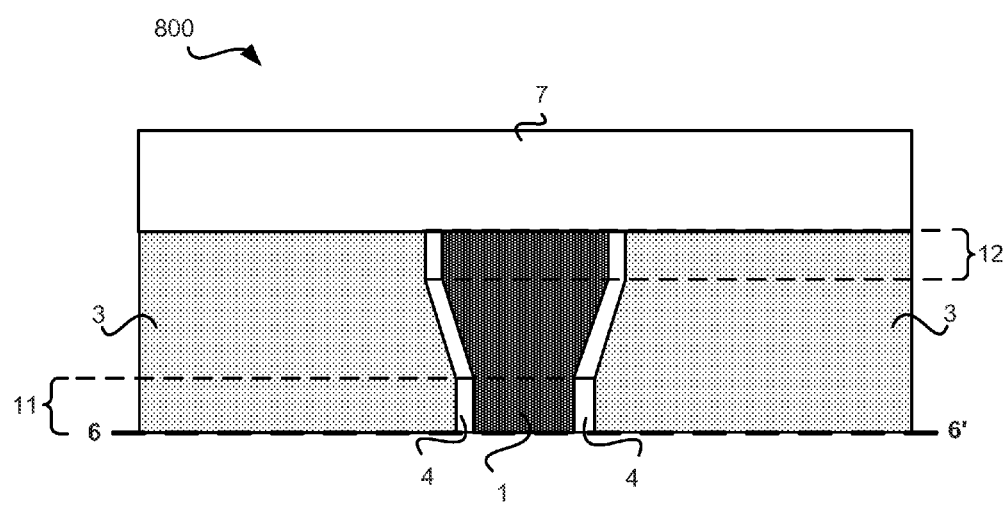
FIG. 8 shows a top view of a magnetic head, according to one embodiment.

FIG. 8 is a top view of a magnetic head 800 according to one embodiment. As shown in FIG. 8, a cross-section of the free layer 1 in the plane of deposition thereof has a shape defined by a first rectangular shape (denoted by area 11) near to the ABS and a trapezoidal shape (denoted by area between 11 and 12) at a point away from the ABS adjacent to a second rectangular shape (denoted by area 12), wherein a narrow portion of the trapezoidal shaped portion is positioned adjacent the first rectangular shaped portion and a wide portion of the trapezoidal shaped portion is positioned adjacent the second rectangular shaped portion. With this free layer shape, it is possible to restrict variations such that they are consistent with a conventional shape having a constant track width, while enjoying the benefits of having a variable width shape. This restriction is possible where, in combination with the shapes shown in FIGS. 5A-7, a magnetic head shape is formed to have a consistent-track-width region 11 in the vicinity of the ABS and a consistent-track-width region 12 in the vicinity of the boundary between the free layer 1 and the second insulating film 7. The effect of reduced head resistance is also diminished, and therefore the above shape is employed in some preferred embodiments. It should be noted that in the embodiments shown in FIGS. 5B-8, the combined shield/electrode layer 5, 15 may actually be formed below and/or above the free layer 1 and the hard magnetic film 2.

A fabrication method for producing the magnetic head shown in FIG. 5B is described in FIGS. 9A-13B, with the "A" figures showing a top view parallel to the plane of deposition, and the "B" figures showing a cross-section from the straight line 9-9' in the top view, e.g., from the ABS.

Figure 9A:
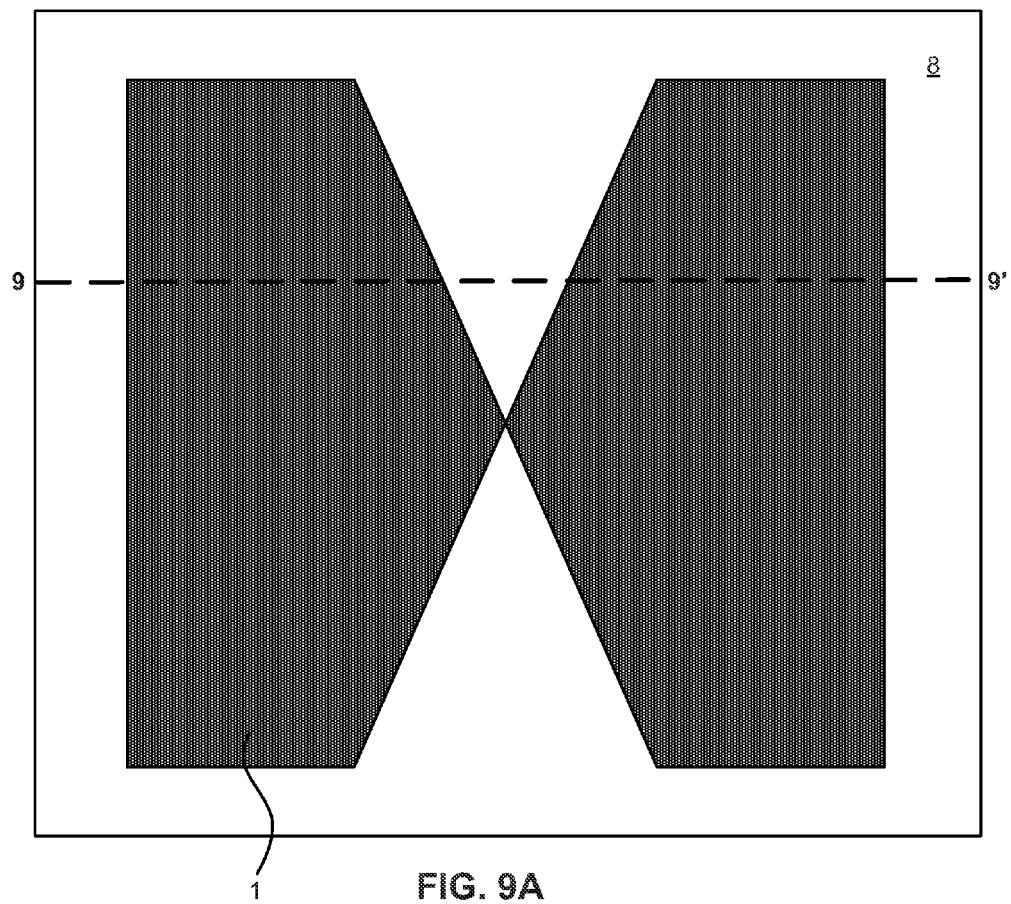
FIG. 9A is an illustrative representation of a top view of a magnetic head during formation, according to one embodiment.
Figure 9B:
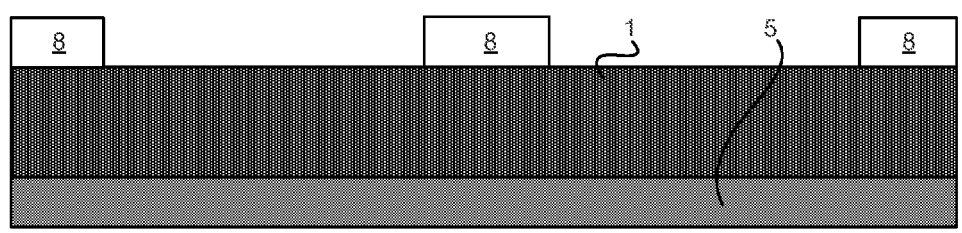
FIG. 9B is an illustrative representation of a cross-section of the magnetic head as seen from the ABS during formation, according to one embodiment.

As shown in FIG. 9A, in order to form the track pattern, a photoresist and a mask material are coated or formed as a film 8 on the combined shield/electrode layer 5 which is formed on a substrate (not shown), and the mask material 8 is patterned by means of photolithography, etching such as RIE, or any other suitable method as would be appreciated by those having ordinary skill in the art upon reading the present descriptions.

Using the following process, the shape shown in FIG. 5B may be obtained by forming the mask 8 into a pattern such as that shown in FIG. 9A. In addition, after the lapping process, a wedge shape is formed at the center of the ABS, such that collapse of the mask material is readily prevented, even in regions of the mask material where the track pattern is very narrow. Furthermore, after the lapping process, the ABS is formed with a consistent track width, which makes it possible to produce the shape shown in FIG. 6. It should be noted that when photolithography is employed, the corners of the pattern are often rounded, and therefore it is advantageous to optimize the exposure conditions so that the narrow track width and the pattern shape thereof are maintained.

Figure 10A:
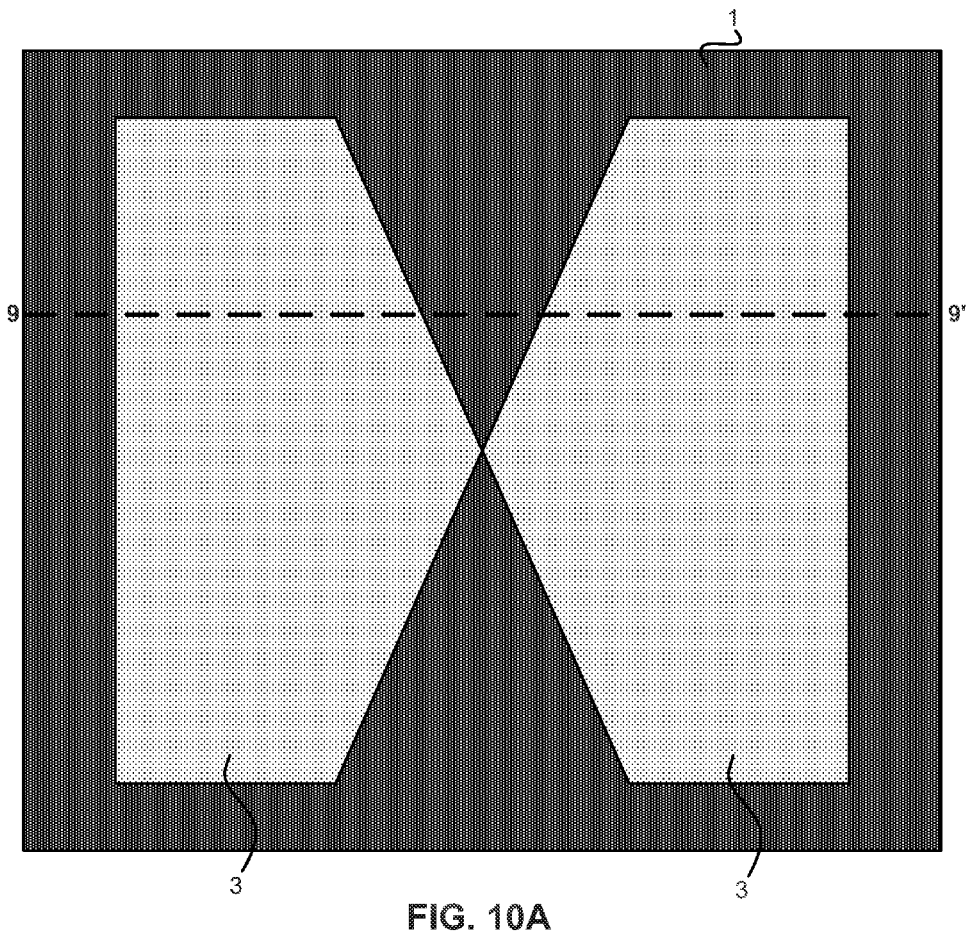
FIG. 10A is an illustrative representation of a top view of a magnetic head during formation, according to one embodiment.
Figure 10B:
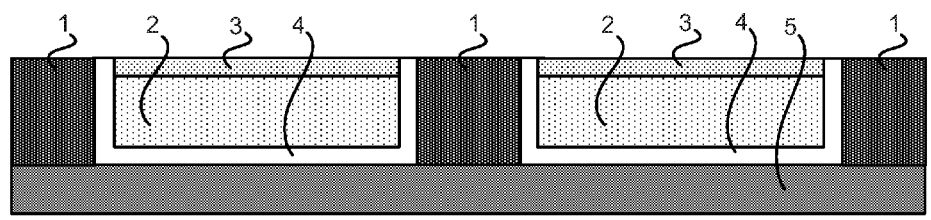
FIG. 10B is an illustrative representation of a cross-section of the magnetic head as seen from the ABS during formation, according to one embodiment.

FIGS. 10A-10B show a shape which may be produced after formation of the layers above the shield layer 5 after the mask material 8 has been patterned, according to one embodiment. As shown in FIGS. 10A-10B, the free layer 1 has been etched by milling or RIE, the insulating film 4, hard magnetic film 2, and capping film 3 of the hard magnetic film 2 have been formed, and the insulating film 4, hard magnetic film 2 and capping film 3 on the free layer 1 have been removed by lift-off. An insulating material, such as alumina, may be used as the insulating film 4, CoPt, CoCrPt, or some other suitable material may be used as the hard magnetic film 2, and a material comprising nonmagnetic metal may be used for the capping film 3. It should be noted that if the track width is narrow, the volume of the mask material 8 is very much reduced, and therefore lift-off may be difficult, but it is possible to achieve a suitable volume for the mask material by using the shape in FIG. 9A, and lift off is more easily facilitated.

Figure 11A:
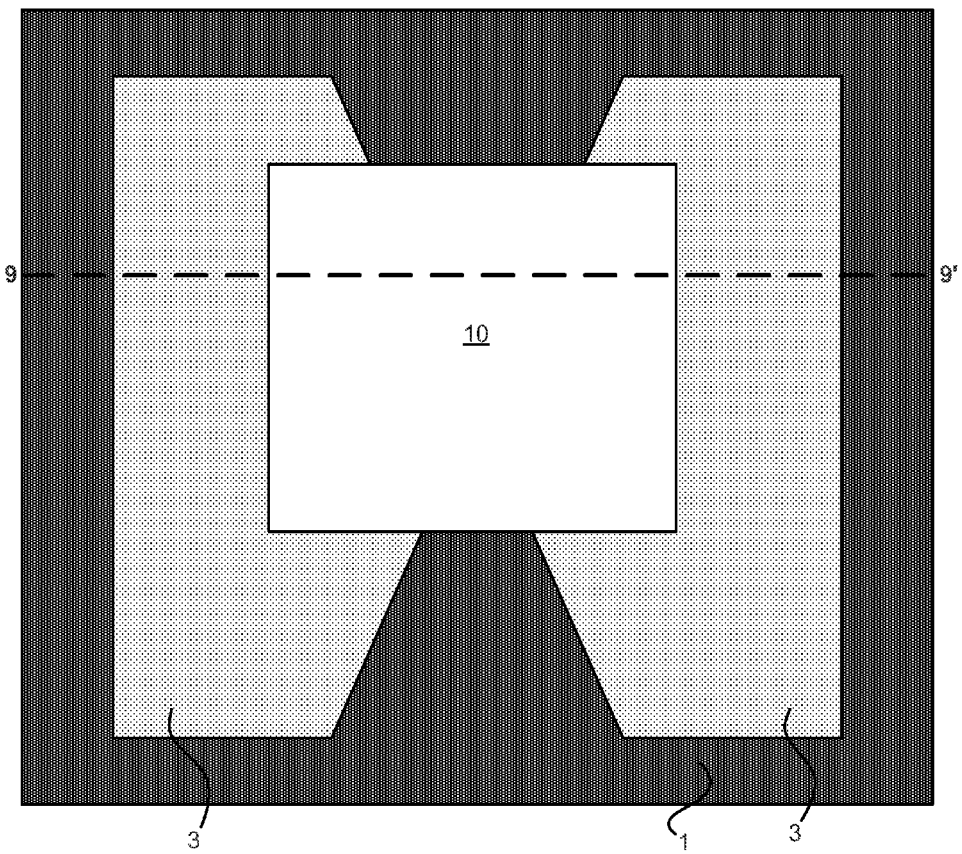
FIG. 11A is an illustrative representation of a top view of a magnetic head during formation, according to one embodiment.
Figure 11B:
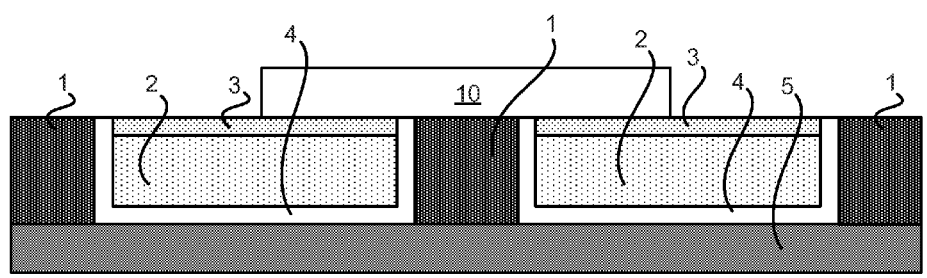
FIG. 11B is an illustrative representation of a cross-section of the magnetic head as seen from the ABS during formation, according to one embodiment.

Next, as shown in FIGS. 11A-11B, in order to form the height pattern, another photoresist and/or another mask material 10 are coated or formed as a film on top of the structure shown in FIGS. 10A-10B, and the mask material 10 is patterned by photolithography and/or etching, such as RIE. In this process, misalignment in overlaying of the track pattern formed in FIGS. 9A-10B increases the variations in the final head resistance, and therefore when the patterning in FIG. 9A is carried out, the region where the track pattern and the height pattern lie one over the other is patterned with a consistent track width, whereby the shape in FIG. 7 is produced, and it is possible to eliminate any negative effects of overlaying misalignment, as seen in prior art formation methods.

Figure 12A:
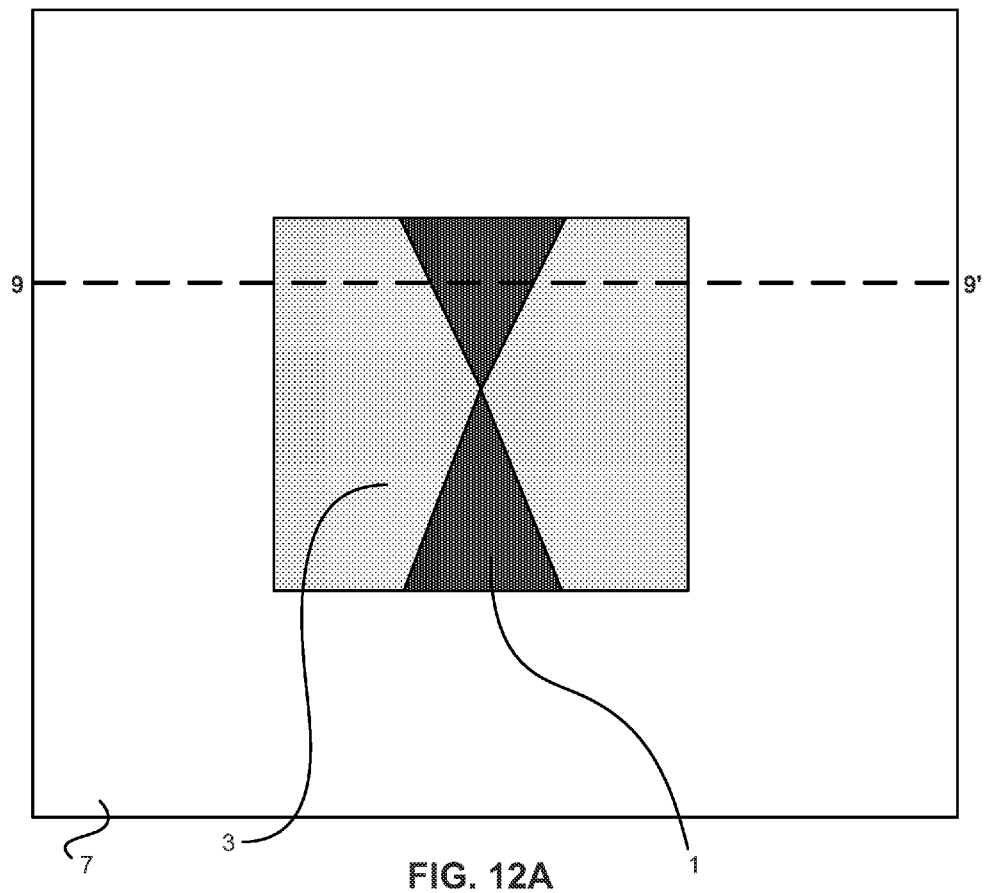
FIG. 12A is an illustrative representation of a top view of a magnetic head during formation, according to one embodiment.
Figure 12B:
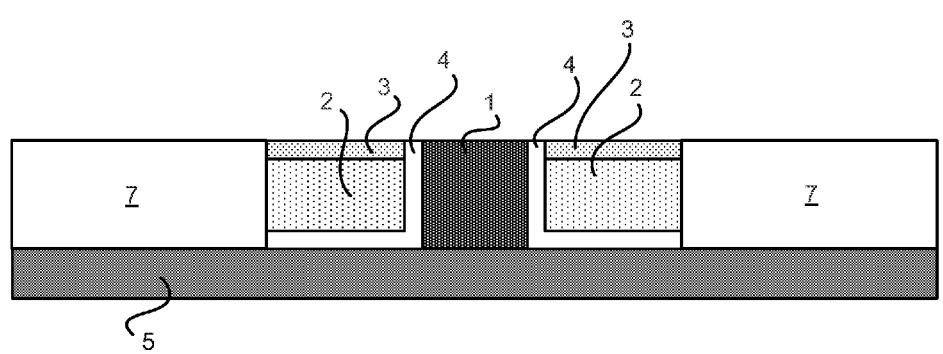
FIG. 12B is an illustrative representation of a cross-section of the magnetic head as seen from the ABS during formation, according to one embodiment.

FIGS. 12A-12B show a magnetic head after the mask material 10 has been patterned, in which the free layer 1, hard magnetic film 2, and capping film 3 have been etched by milling and/or RIE, the second insulating film 7 has been formed, and the second insulating film 7 above the free layer 1 has been removed by lift-off. An insulating material, such as alumina, may be used as the second insulating film 7.

Figure 13A:
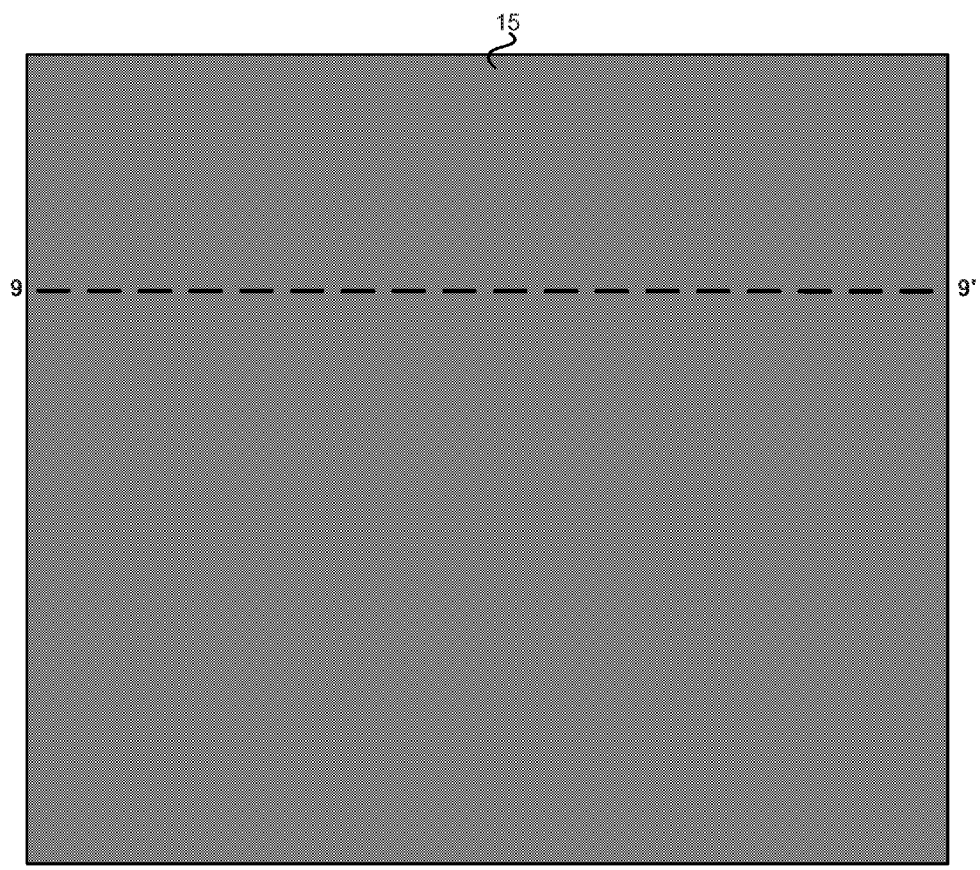
FIG. 13A is an illustrative representation of a top view of a magnetic head during formation, according to one embodiment.
Figure 13B:
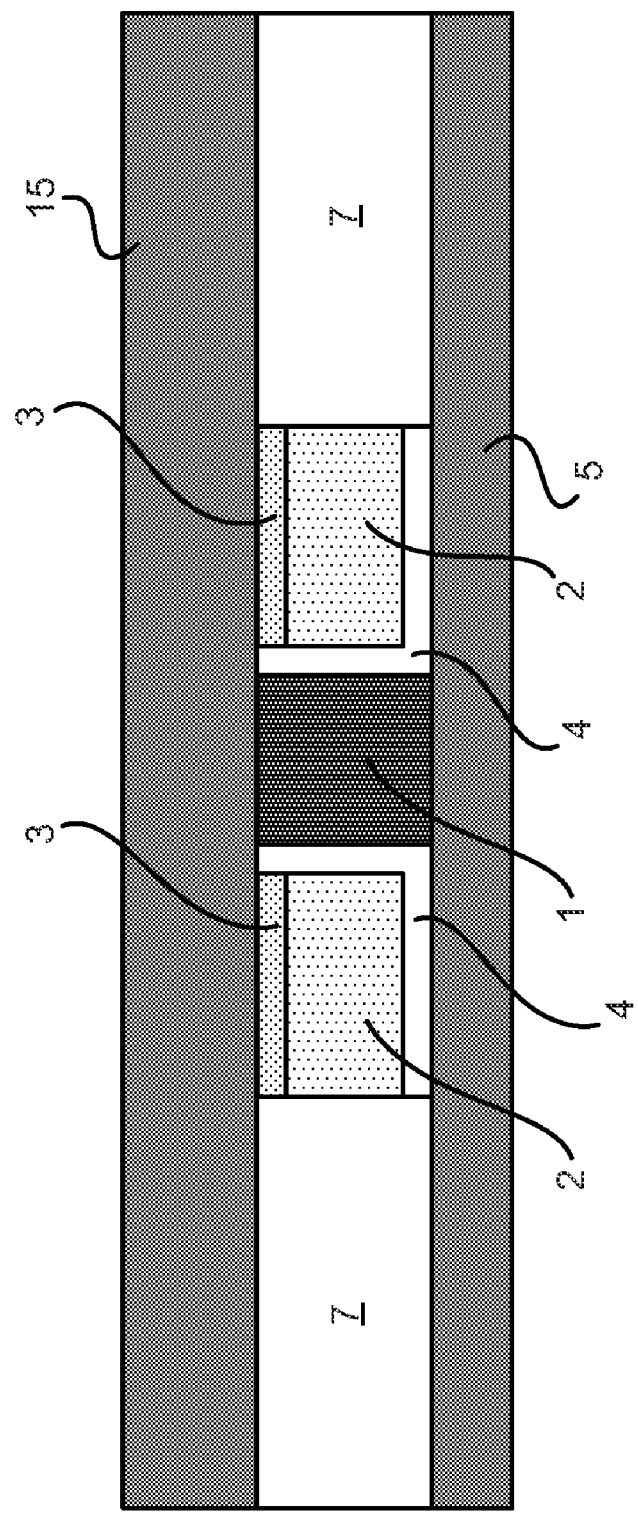
FIG. 13B is an illustrative representation of a cross-section of the magnetic head as seen from the ABS during formation, according to one embodiment.

The combined shield/electrode layer (which includes first shield 5 and second shield 15) may comprise a soft magnetic material that is formed above and/or below the structure as shown in FIGS. 13A-13B. In one embodiment, NiFe may be used as the soft material of the combined shield/electrode layer 5, 15.

It should be noted that the positive effects of producing a magnetic head as described herein is also achieved if the procedure in FIGS. 9A-13B is reversed, e.g., the track pattern is formed after the height pattern has been formed.

FIGS. 14-17 depict graphs showing properties of a magnetic head produced using the above fabrication process. Calculations were performed for embodiments having a sensor width at the ABS of 20 nm, 30 nm, and 45 nm, and a magnetic head with a shape substantially as shown in FIG. 5B. Furthermore, the height of the sensor from the ABS in the height direction was fixed at 65 nm for these calculations.

Figure 14:
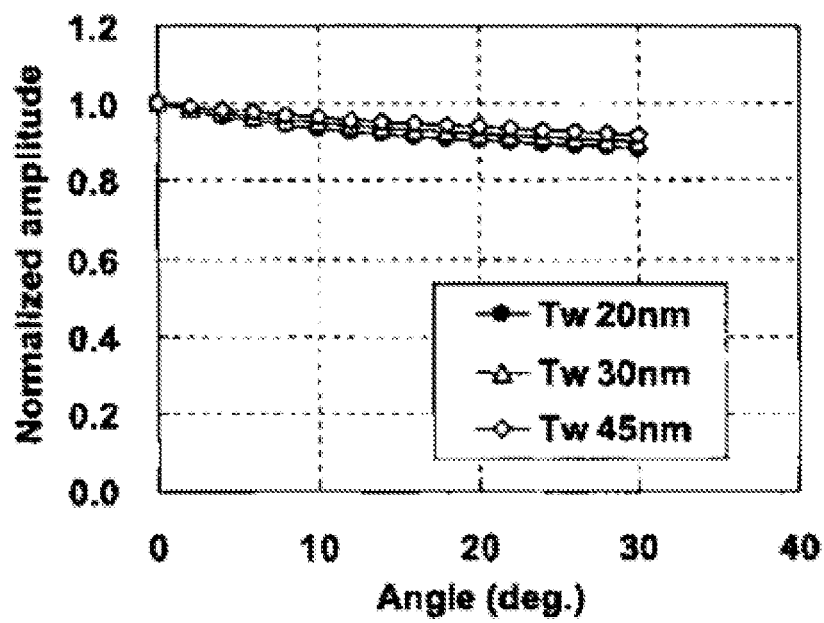
FIG. 14 shows a graph of the normalized reproduction output with respect to the angle formed by the spread of the track width and the direction perpendicular to the ABS, according to one embodiment.

FIG. 14 shows the reproduction output, normalized at that point, with respect to the angle θ formed by the spread of the track width and a direction perpendicular to the ABS. It should be noted that the reproduction output was calculated taking into account damping of the magnetization rotation angle of the magnetization free layer of the TMR film in the ABS height direction of the TMR film, and also taking into account the fact that there is a greater component which does not contribute to the magnetic resistance in the track region deeper in from the ABS.

Figure 15:
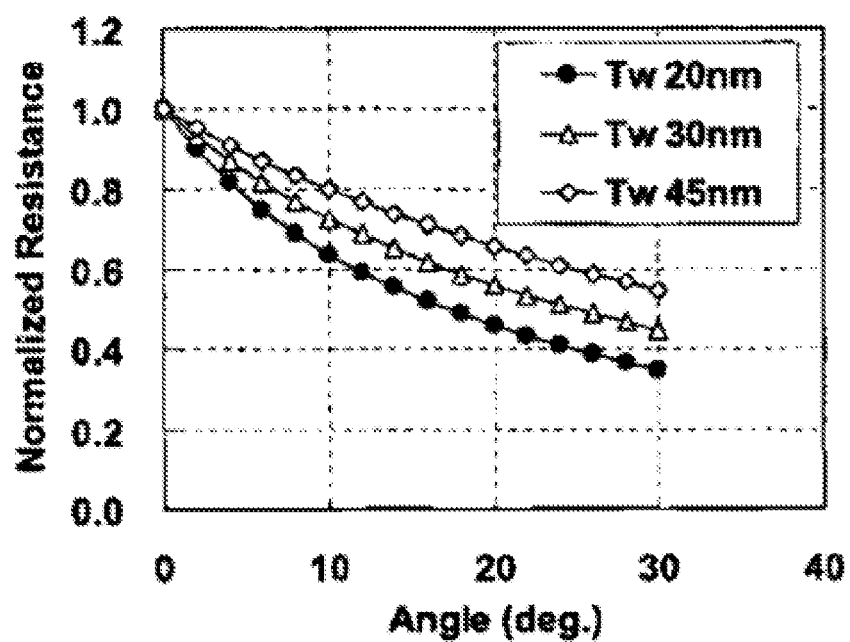
FIG. 15 is a graph of the normalized resistance of the reproduction element, calculated from the amount of increase in area, with respect to the angle foamed by the spread of the track width and the direction perpendicular to the ABS.

FIG. 15 shows a normalized resistance of the reproduction element, calculated from the amount of increase in area, with respect to the angle θ formed by the spread of the track width and the direction perpendicular to the ABS.

Figure 16:
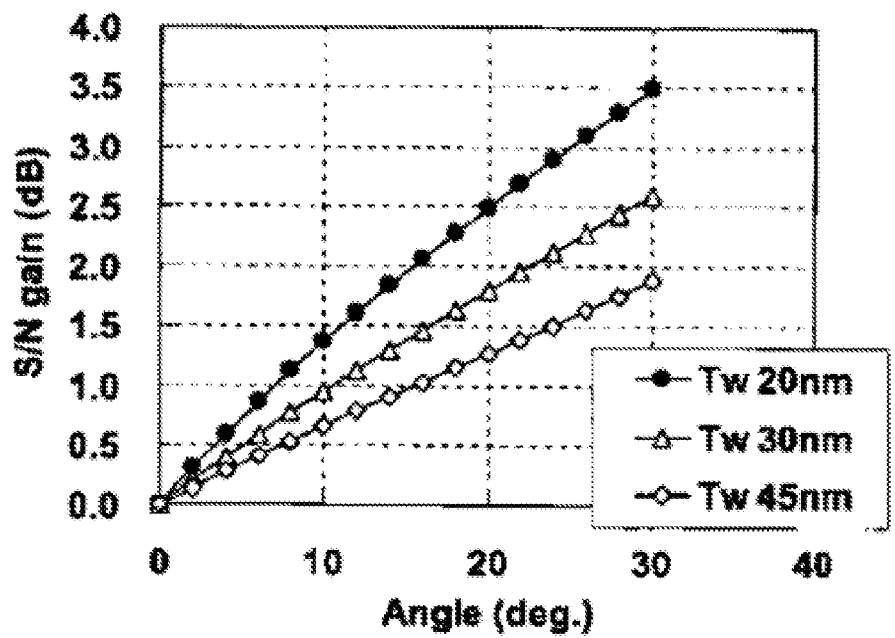
FIG. 16 is a graph of the gain in the normalized S/N ratio, calculated from the output of the resistance component, with respect to the angle formed by the spread of the track width and the direction perpendicular to the ABS.

FIG. 16 shows gain in the normalized signal to noise (S/N) ratio, calculated from the output and resistance of the resistance component, with respect to the angle θ formed by spread of the track width and the direction perpendicular to the ABS. It is clear from FIGS. 14-16 that although the reproduction output decreases the greater the angle θ, the proportion of the amount of decrease in the element resistance compared with the proportion of the amount of decrease in the reproduction output is greater, so as a result the S/N gain is greatly increased. In addition, this effect is enhanced the narrower the track width exposed at the ABS. However, the calculations are made assuming a simple model, and therefore the absolute values of the S/N gain are reference values only, and not meant to be limiting in any way.

Figure 17:
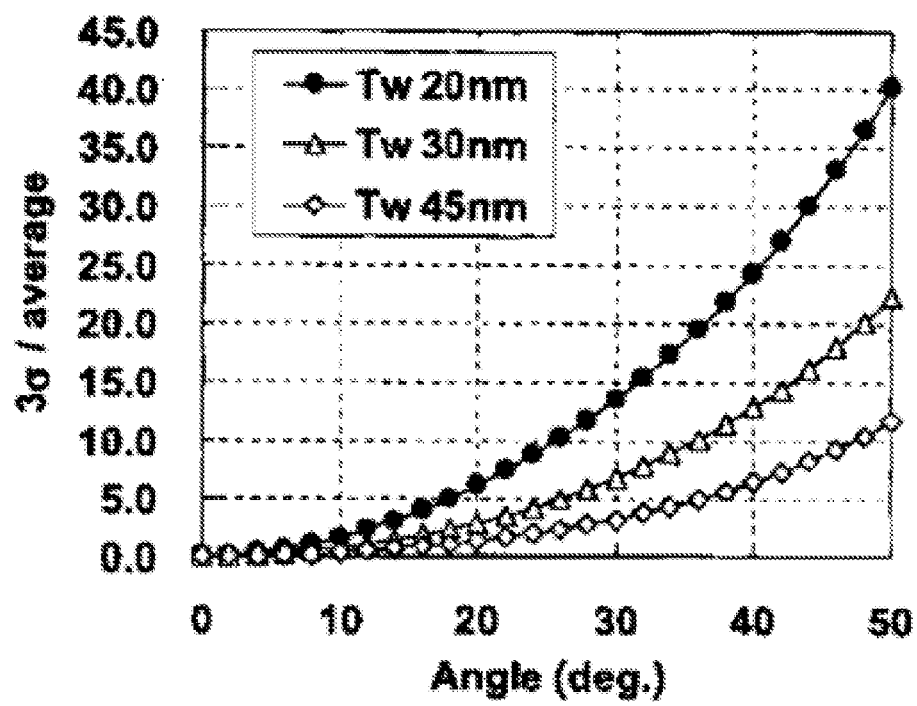
FIG. 17 is a graph of values of variations in the track width exposed at the ABS divided by the average track width, calculated taking the variations from the lapping process as being ±5 nm, with respect to the angle formed by the spread of the track width and the direction perpendicular to the ABS.

FIG. 17 shows values of variations in the track width exposed at the ABS divided by the average track width, calculated taking the variations from the lapping process as being ±5 nm, with respect to the angle θ formed by the spread of the track width and the direction perpendicular to the ABS. The variations due to the lapping process sharply increase in the region where the angle θ exceeds 20°. In addition, if variations in the placement of the track pattern and the height pattern one over the other are also taken into account, the variations are considered to be doubled, although this is not shown in the calculations. When these variations are taken into account, the angle θ is preferably no more than about 20°. When the shapes in FIGS. 6-8 are used, it is considered that variations of the above kind may be ignored, but the amount of increase in the element cross-sectional area in those cases is also reduced, and therefore the S/N gain decreases.

Figure 18:
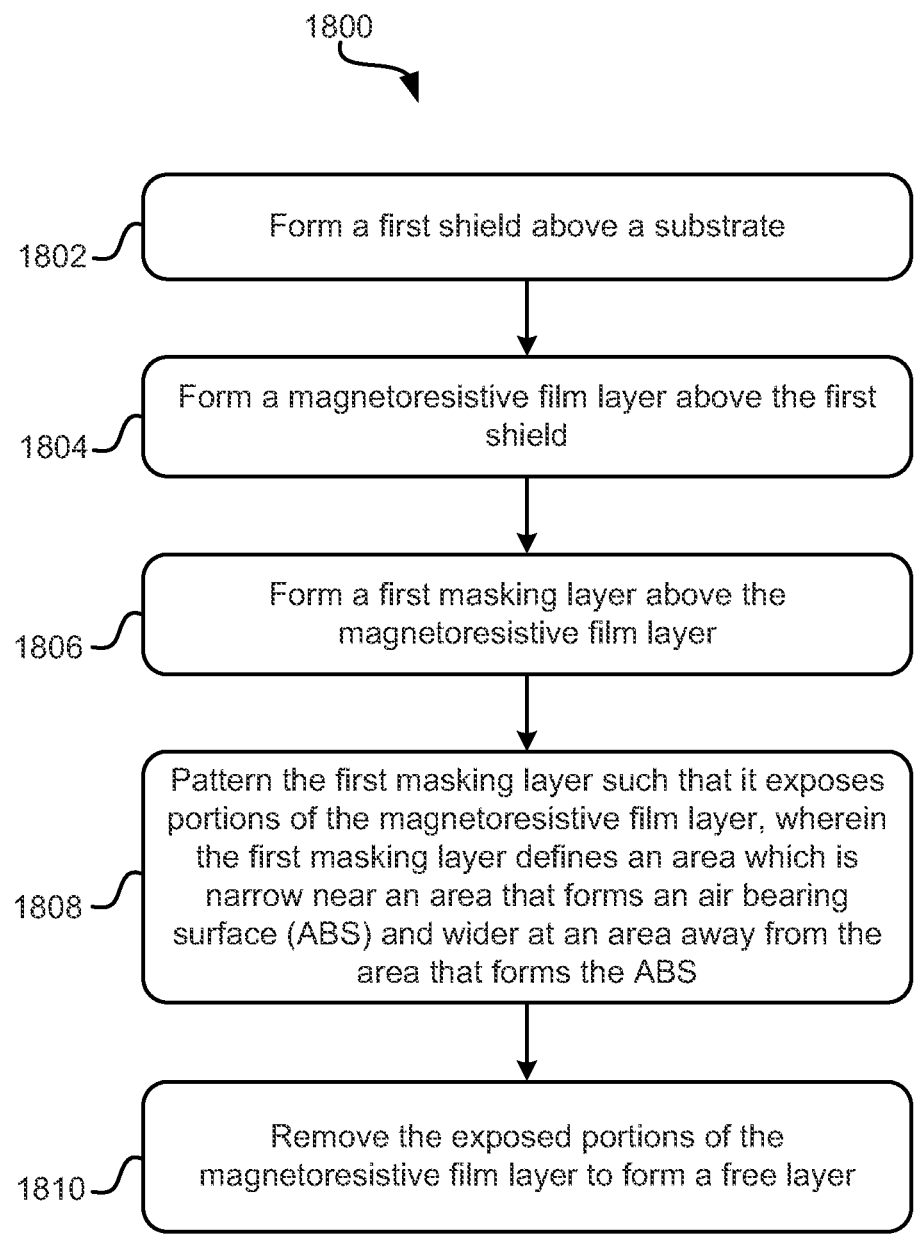
FIG. 18 shows a flowchart of a method, according to one embodiment.

Now referring to FIG. 18, a method 1800 is shown according to one embodiment. The method 1800 may be carried out in any desired environment, including those shown herein and others not specifically described.

In operation 1802, a first shield is formed above a substrate. The shield layer may comprise any suitable material, as would be apparent to one of skill in the art upon reading the present descriptions.

In operation 1804, a magnetoresistive film layer is formed above the first shield. The magnetoresistive film layer may comprise any suitable material, as would be apparent to one of skill in the art upon reading the present descriptions.

In operation 1806, a first masking layer is formed above the magnetoresistive film layer. The first masking layer may comprise any suitable material, as would be apparent to one of skill in the art upon reading the present descriptions, such as photoresist, etc.

In operation 1808, the first masking layer is patterned such that it exposes portions of the magnetic layer, wherein the first masking layer defines an area which is narrow near an area that forms an ABS and wider at an area away from the area that forms the ABS. The patterning may be performed using any suitable method, as would be apparent to one of skill in the art upon reading the present descriptions, such as etching including RIE, chemical-mechanical polishing (CMP), photolithography, etc.

In operation 1810, the exposed portions of the magnetic layer are removed to form a free layer. The removal may comprise any suitable method, as would be apparent to one of skill in the art upon reading the present descriptions, such as lift-off, peeling, planarizing, etc.

Any formation methods as would be apparent to one of skill in the art upon reading the present descriptions may be used to form the layers described in operations 1802-1810, such as plating, sputtering, chemical vapor deposition (CVD), plasma-enhanced chemical vapor deposition (PECVD), etc., according to various embodiments.

In some embodiments, a cross-section of the free layer in a plane of deposition thereof has a trapezoidal shape, wherein a narrow portion of the trapezoidal shaped portion is positioned nearer to the area that forms the ABS than a wide portion of the trapezoidal shaped portion.

In other embodiments, a cross-section of the free layer in a plane of deposition thereof has a shape defined by a rectangular shape near to the area that forms the ABS and a trapezoidal shape at a point away from the area that forms the ABS, wherein a narrow portion of the trapezoidal shaped portion is positioned adjacent the rectangular shaped portion.

In yet other embodiments, a cross-section of the free layer in a plane of deposition thereof has a shape defined by a first rectangular shape near to the area that forms the ABS and a trapezoidal shape at a point away from the area that forms the ABS adjacent to a second rectangular shaped portion, wherein a narrow portion of the trapezoidal shaped portion is positioned adjacent the first rectangular shaped portion and a wide portion of the trapezoidal shaped portion is positioned adjacent the second rectangular shaped portion.

In any of these embodiments, an angle formed between a direction normal to the ABS and an edge of the trapezoidal shaped portion leading away from the ABS may be greater than 0° and less than about 20°.

In one additional embodiment, an insulating film may be formed above exposed portions of the first shield and on sides of the free layer, a hard magnetic film may be formed above the insulating film, a capping film may be formed above the hard magnetic film, and the first masking layer, the insulating film, the hard magnetic film, and the capping film above the free layer may be removed.

In a further embodiment, a second masking layer may be formed above portions of the magnetoresistive film layer (including all or some of the free layer), the insulating film, and the capping film. Also, the second masking layer may be patterned such that it exposes portions of the magnetoresistive layer, the insulating film, and the capping film, the exposed portions of the magnetoresistive film layer, the insulating film, the hard magnetic film, and the capping film may be removed, and a second insulating film may be formed above the second masking layer and exposed portions of the first shield. The hard magnetic film, insulating film, second masking layer, second insulating film, and capping film may comprise any suitable materials, as would be apparent to one of skill in the art upon reading the present descriptions.

According to another embodiment, a second shield may be formed above the second insulating film, the free layer, the insulating film, and the capping film.

In another embodiment, lapping across the area that forms the ABS may be performed to form the ABS.

Of course, the formation, removal, and processing of any and/or all films and layers described in relation to method 1800 may be performed according to methods known to one of skill in the art.

It should be noted that methodology presented herein for at least some of the various embodiments may be implemented, in whole or in part, in computer hardware, software, by hand, using specialty equipment, etc., and combinations thereof.

While various embodiments have been described above, it should be understood that they have been presented by way of example only, and not limitation. Thus, the breadth and scope of an embodiment of the present invention should not be limited by any of the above-described exemplary embodiments, but should be defined only in accordance with the following claims and their equivalents.

What is claimed is:

1. A magnetic head, comprising:
    a magnetoresistive free layer, wherein a width of the free layer in a track width direction nearest an air bearing surface (ABS) is less than a width of the free layer in the track width direction at a point away from the ABS;
    wherein the magnetic head is configured to pass a sense current in a direction perpendicular to a plane of deposition of the free layer,
    wherein a cross-section of the free layer in the plane of deposition thereof has a first portion having a trapezoidal shape and a second portion having a rectangular shape, the first portion extending in the track width direction to opposite edges of the free layer, the second portion also extending in the track width direction to the opposite edges of the free layer.

2. The magnetic head as recited in claim 1, further comprising a tunnel barrier layer adjacent the free layer, thereby forming a tunneling magnetoresistive (TMR) sensor of the magnetic head.

3. The magnetic head as recited in claim 1, further comprising:
    a shield layer in electrical communication with the free layer and located relative thereto in a direction normal to the track width direction;
    a hard magnetic film positioned near the free layer on either side of the free layer in the track width direction; and
    a capping film positioned above the hard magnetic film and the free layer.

4. The magnetic head as recited in claim 3, further comprising an insulating film positioned on either side of the free layer in the track width direction between the free layer and the hard magnetic film.

5. The magnetic head as recited in claim 1, wherein a narrow portion of the trapezoidal shaped portion is positioned nearer to the ABS than a wide portion of the trapezoidal shaped portion.

6. The magnetic head as recited in claim 5, wherein an angle formed between a direction normal to the ABS and an edge of the trapezoidal shaped free layer leading away from the ABS is greater than 0° and less than about 20°.

7. The magnetic head as recited in claim 5, wherein the cross-section of the free layer in the plane of deposition thereof has another portion having a rectangular shape at a point away from the ABS, wherein a wide portion of the trapezoidal shaped portion is positioned adjacent the rectangular shaped portion.

8. A magnetic data storage system, comprising:
    at least one magnetic head as recited in claim 1;
    a magnetic medium;
    a drive mechanism for passing the magnetic medium over the at least one magnetic head; and
    a controller electrically coupled to the at least one magnetic head for controlling operation of the at least one magnetic head.

9. A method for creating a magnetic head as recited in claim 1, the method comprising:
    forming a first shield above a substrate;
    forming the free layer by:
        forming a magnetoresistive film layer above the first shield;
        forming a first masking layer above the magnetoresistive film layer;
        patterning the first masking layer such that it exposes portions of the magnetoresistive film layer, wherein the first masking layer defines an area which is narrow near an area that forms an air bearing surface (ABS) side of the free layer and wider at an area away from the ABS side of the free layer; and
        removing the exposed portions of the magnetoresistive film layer to define the free layer.

10. The method as recited in claim 9, further comprising:
    forming an insulating film above exposed portions of the first shield and on sides of the free layer;
    forming a hard magnetic film near opposite sides of the free layer in a track width direction relative thereto and above the insulating film;
    forming a capping film above the hard magnetic film; and
    removing the first masking layer, the insulating film, the hard magnetic film, and the capping film above the free layer.

11. The method as recited in claim 10, further comprising:
    forming a second masking layer above portions of the magnetoresistive film layer, the insulating film, and the capping film;
    patterning the second masking layer such that it exposes portions of the magnetoresistive film layer, the insulating film, and the capping film;
    removing the exposed portions of the magnetoresistive film layer, the insulating film, the hard magnetic film, and the capping film;
    forming a second insulating film above the second masking layer and exposed portions of the first shield; and
    removing the second masking layer, thereby removing a portion of the second insulating film above the free layer, the insulating film, and the capping film.

12. The method as recited in claim 9, wherein the patterning comprises at least one of photolithography and etching.

13. The method as recited in claim 9, further comprising lapping across the area that forms the ABS side of the free layer.

14. The method as recited in claim 9, wherein a narrow portion of the trapezoidal shaped portion is positioned nearer to the ABS than a wide portion of the trapezoidal shaped portion.

15. The method as recited in claim 14, wherein an angle formed between a direction normal to the ABS and an edge of the trapezoidal shaped portion leading away from the ABS is greater than 0° and less than about 20°.

16. The method as recited in claim 9, wherein the portion having the rectangular shape is positioned near to the ABS and the portion having the trapezoidal shape is positioned at a point away from the ABS, wherein a narrow portion of the trapezoidal shaped portion is positioned adjacent the rectangular shaped portion.

17. The method as recited in claim 16, wherein an angle formed between a direction normal to the ABS and an edge of the trapezoidal shaped portion leading away from the rectangular shaped portion is greater than 0° and less than about 20°.

18. The method as recited in claim 9, wherein the portion having the first rectangular shape is positioned near to the ABS and portion having the trapezoidal shape is positioned at a point away from the ABS adjacent to a portion having a second rectangular shape, wherein a narrow portion of the trapezoidal shaped portion is positioned adjacent the first rectangular shaped portion and a wide portion of the trapezoidal shaped portion is positioned adjacent the second rectangular shaped portion.

19. The method as recited in claim 18, wherein an angle formed between a direction normal to the ABS and an edge of the trapezoidal shaped portion leading away from the first rectangular shaped portion is greater than 0° and less than about 20°.

20. A magnetic head, comprising:
a magnetoresistive free layer, wherein a width of the free layer in a track width direction nearest an air hearing surface (ABS) is less than a width of the free layer in the track width direction at a point away from the ABS;
wherein the magnetic head is configured to pass a sense current in a direction perpendicular to a plane of deposition of the free layer,
wherein a cross-section of the free layer in the plane of deposition thereof has a portion having a rectangular shape near to the ABS and a portion having a trapezoidal shape at a point away from the ABS, wherein a narrow portion of the trapezoidal shaped portion is positioned adjacent the rectangular shaped portion.

21. The magnetic head as recited in claim 20, wherein an angle formed between a direction normal to the ABS and an edge of the portion having the trapezoidal shape leading away from the rectangular shaped portion is greater than 0° and less than about 20°.

22. A magnetic data storage system, comprising:
at least one magnetic head as recited in claim 20;
a magnetic medium;
a drive mechanism for passing the magnetic medium over the at least one magnetic head; and
a controller electrically coupled to the at least one magnetic head for controlling operation of the at least one magnetic head.

23. A magnetic head, comprising:
a magnetoresistive free layer, wherein a width of the free layer in a track width direction nearest an air bearing surface (ABS) is less than a width of the free layer in the track width direction at a point away from the ABS;
wherein the magnetic head is configured to pass a sense current in a direction perpendicular to a plane of deposition of the free layer,
wherein a cross-section of the free layer in the plane of deposition thereof has a portion having a first rectangular shape near to the ABS and portion having a trapezoidal shape at a point away from the ABS adjacent to a portion having a second rectangular shape, wherein a narrow portion of the trapezoidal shaped portion is positioned adjacent the first rectangular shaped portion and a wide portion of the trapezoidal shaped portion is positioned adjacent the second rectangular shaped portion.

24. The magnetic head as recited in claim 23, wherein an angle formed between a direction normal to the ABS and an edge of the trapezoidal shaped portion leading away from the first rectangular shaped portion is greater than 0° and less than about 20°.

25. A magnetic data storage system, comprising:
at least one magnetic head as recited in claim 23;
a magnetic medium;
a drive mechanism for passing the magnetic medium over the at least one magnetic head; and
a controller electrically coupled to the at least one magnetic head for controlling operation of the at least one magnetic head.

* * * * *

UNITED STATES PATENT AND TRADEMARK OFFICE
CERTIFICATE OF CORRECTION

PATENT NO. : 8,339,752 B1
APPLICATION NO. : 13/245708
DATED : December 25, 2012
INVENTOR(S) : Hattori et al.

It is certified that error appears in the above-identified patent and that said Letters Patent is hereby corrected as shown below:

Title Page:

Item (54) and in the Specification, Column 1, Lines 1-4 should read:

--MAGNETIC HEAD WITH WIDE SENSOR BACK EDGE, LOW RESISTANCE, AND HIGH SIGNAL-TO-NOISE RATIO AND METHODS OF PRODUCTION THEREOF--;

In the Specification:

col. 3, line 25 replace "foamed" with --formed--;

col. 5, line 1 replace "cod" with --coil--.

Signed and Sealed this
Fourteenth Day of May, 2013

Teresa Stanek Rea
*Acting Director of the United States Patent and Trademark Office*